(12) United States Patent
Jacobsson et al.

(10) Patent No.: US 7,456,664 B2
(45) Date of Patent: Nov. 25, 2008

(54) DELAY LOCKED LOOP WITH PRECISION CONTROLLED DELAY

(75) Inventors: Harald Jacobsson, Västra Frölunda (SE); Spartak Gevorgian, Göteborg (SE); Thomas Lewin, Onsala (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 101 days.

(21) Appl. No.: 10/581,786

(22) PCT Filed: Dec. 10, 2003

(86) PCT No.: PCT/SE03/01918

§ 371 (c)(1),
(2), (4) Date: Jun. 6, 2006

(87) PCT Pub. No.: WO2005/057718

PCT Pub. Date: Jun. 23, 2005

(65) Prior Publication Data

US 2007/0139089 A1    Jun. 21, 2007

(51) Int. Cl.
*H03L 7/06* (2006.01)
(52) U.S. Cl. .............. 327/158; 327/161; 327/268; 327/283; 327/290
(58) Field of Classification Search ............ 327/158, 327/161, 268, 283, 290
See application file for complete search history.

(56) References Cited

U.S. PATENT DOCUMENTS

| | | | |
|---|---|---|---|
| 3,768,046 A * | 10/1973 | Lorber et al. ............... 333/160 |
| 5,679,624 A * | 10/1997 | Das ............................ 505/210 |
| 6,125,157 A | 9/2000 | Donnelly et al. | |
| 6,350,335 B1 | 2/2002 | Hampel et al. | |
| 6,396,338 B1 * | 5/2002 | Huang et al. ................ 329/336 |
| 7,154,978 B2 * | 12/2006 | Juan et al. .................... 375/376 |
| 2002/0140471 A1 * | 10/2002 | Fiscus ......................... 327/158 |
| 2003/0067334 A1 * | 4/2003 | Brass et al. ................... 327/158 |
| 2003/0099321 A1 * | 5/2003 | Juan et al. .................... 375/376 |

FOREIGN PATENT DOCUMENTS

WO    99/43036    8/1999

OTHER PUBLICATIONS

Eto et al., *A 333MHz, 20mW, 18ps resolution digital DLL using current-controlled delay with parallel variable resistor DAC (PVR-DAC)*, Proceedings of the Second IEEE Asia Pacific Conference on Asics, 2000, pp. 349-350.

* cited by examiner

*Primary Examiner*—Kenneth B. Wells
*Assistant Examiner*—John W Poos
(74) *Attorney, Agent, or Firm*—Nixon & Vanderhye, P.C.

(57) ABSTRACT

The invention discloses a delay-locked loop circuit with input means for a signal that is to be delayed, the input means comprising means for splitting the input signal into a first and a second branch. The signal in the first branch is connected to a component for delaying the signal, and the signal in the second branch is used as a non-delayed reference for the delay caused by the delay component in the first branch. The delay component is a passive tunable delay line, and the circuit comprises tuning means for the tunable delay line, the tuning means being affected by said reference signal, and the first branch comprises output means for outputting a delayed signal with a chosen phase delay. Suitably, the delay component is continuously tunable, for example a tunable ferroelectric delay line.

14 Claims, 3 Drawing Sheets

DELAY LOCKED LOOP WITH PRECISION CONTROLLED DELAY

This application is the U.S. national phase of international application PCT/SE2003/001918 filed 10 Dec. 2003, which designated the U.S., the entire content of which is hereby incorporated by reference.

TECHNICAL FIELD OF THE INVENTION

The present invention relates to a Delay-Locked Loop (DLL) circuit, comprising input means for a signal that is to be delayed, said input means comprising means for splitting said input signal into a first and a second branch, where the signal in the first branch is connected to a component for delaying the signal, and the signal in the second branch is used as a reference for the delay caused by the delay component in the first branch

STATE OF THE ART

Time delay circuits are important building blocks in many electronic systems, such as oscillators, measurement instruments, frequency multipliers, wave-form generators and data and clock recovery circuitry. Most commonly, the desired delay is achieved by use of transmission lines, active circuits, cables (optical or electrical), surface acoustic wave (SAW) circuitry, or magnetostatic wave (MSW) circuitry.

It is often desired, and indeed sometimes required, that the delay can be varied by a control signal. Commonly, there is a desire for the delay to be a certain fraction of a period, or an integer multiple of such a fraction. In such cases, a Delay-Locked-Loop (DLL) is often used. Usually, a DLL is designed by means of active circuits, most commonly inverters. However, in such DLLs, a fixed number, N, of delay cells is used, which means that only phase delays of M/N*360°, where 0<M<N, can be obtained.

BRIEF SUMMARY

Accordingly, as described above, there is a need for a DLL-type circuit where the delay can be chosen by means of a control signal, and where the delay can be chosen in a continuous range, preferably in the entire range of 0-360 degrees.

This need is addressed by a delay-locked loop circuit with input means for a signal that is to be delayed, the input means comprising means for splitting said input signal into a first and a second branch.

The signal in the first branch is connected to a component for delaying the signal, and the signal in the second branch is used as a non-delayed reference for the delay caused by the delay component in the first branch. According to the invention, the delay component is a passive tunable delay line, with the circuit comprising tuning means for the tunable delay line.

The tuning means are affected by said reference signal, and the first branch comprises output means for outputting a delayed signal with a chosen phase delay.

Suitably, the delay component of the circuit is continuously tunable, and preferably passive, such as a tunable ferroelectric delay line. As alternatives to the tunable ferroelectric delay line, mention can be made of SAW-circuits or MSW-circuits.

BRIEF DESCRIPTION OF THE DRAWINGS

The invention will be described in more detail in the following, with reference to the appended drawings, where.

DETAILED DESCRIPTION

Figure 1:
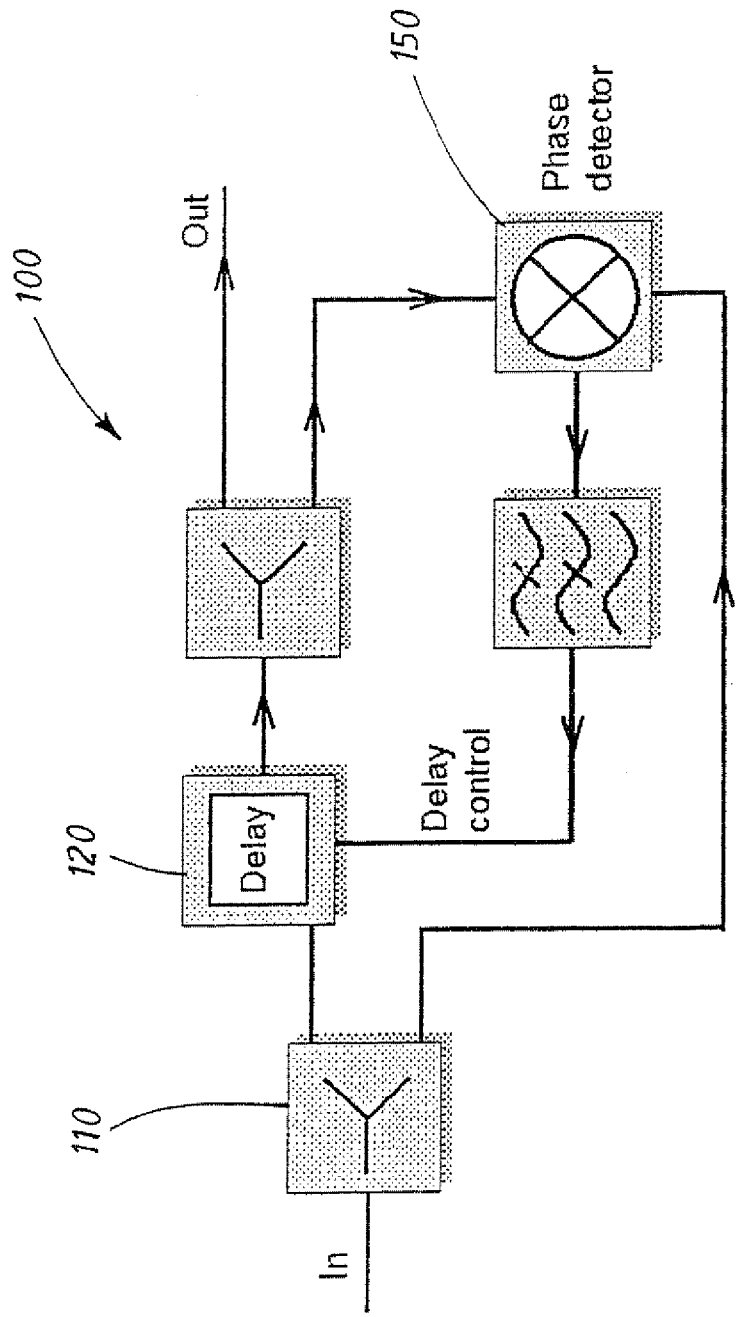
FIG. 1 shows a schematic block diagram of a known delay-locked loop, and FIG. 2 schematically shows the principle behind a delay-locked loop according to an example embodiment.

In order to facilitate the understanding of the present technology, a known delay-locked loop (DLL) circuit 100 is shown in FIG. 1. The circuit 100 in FIG. 1 comprises first input means 110 for an input signal, $I_{in}$, which input means split the input signal into a first and a second input branch.

The signal in the first input branch of the DLL-circuit is input to a tunable delay component 120, which component thus also has an input possibility for the input of a control or tuning signal, said control signal controlling the delay to which the input signal $I_{in}$ is exposed.

The output from the delay component 120 is split into a first and a second output branch, where the first output branch is used as an output signal from the DLL-circuit, the signal having the desired delay.

The signal in the second output branch from the delay component 120 is used as one of two input signals to a phase detector 150.

The signal in the second input branch of the DLL is used as the other of the two input signals to the phase detector 150. Thus, the phase detector serves to detect the phase difference or delay between the non-delayed signal and the output signal from the delay component. The output signal from the phase detector corresponds to the phase difference, and is used as the control signal for the delay component 120 in the first input branch of the DLL-circuit. Suitably, the output signal from the phase detector is passed through a low-pass filter 140 before being input to the delay component 120.

The DLL of FIG. 1 can thus provide a phase delay of an input signal, with the phase delay being varied by means of a control signal. However, in contemporary such DLLs, the most commonly used building block in the delay component are active circuits, usually inverters. The use of, for example, inverters in the DLL will limit the available delays to a certain number of discrete steps.

Figure 2:
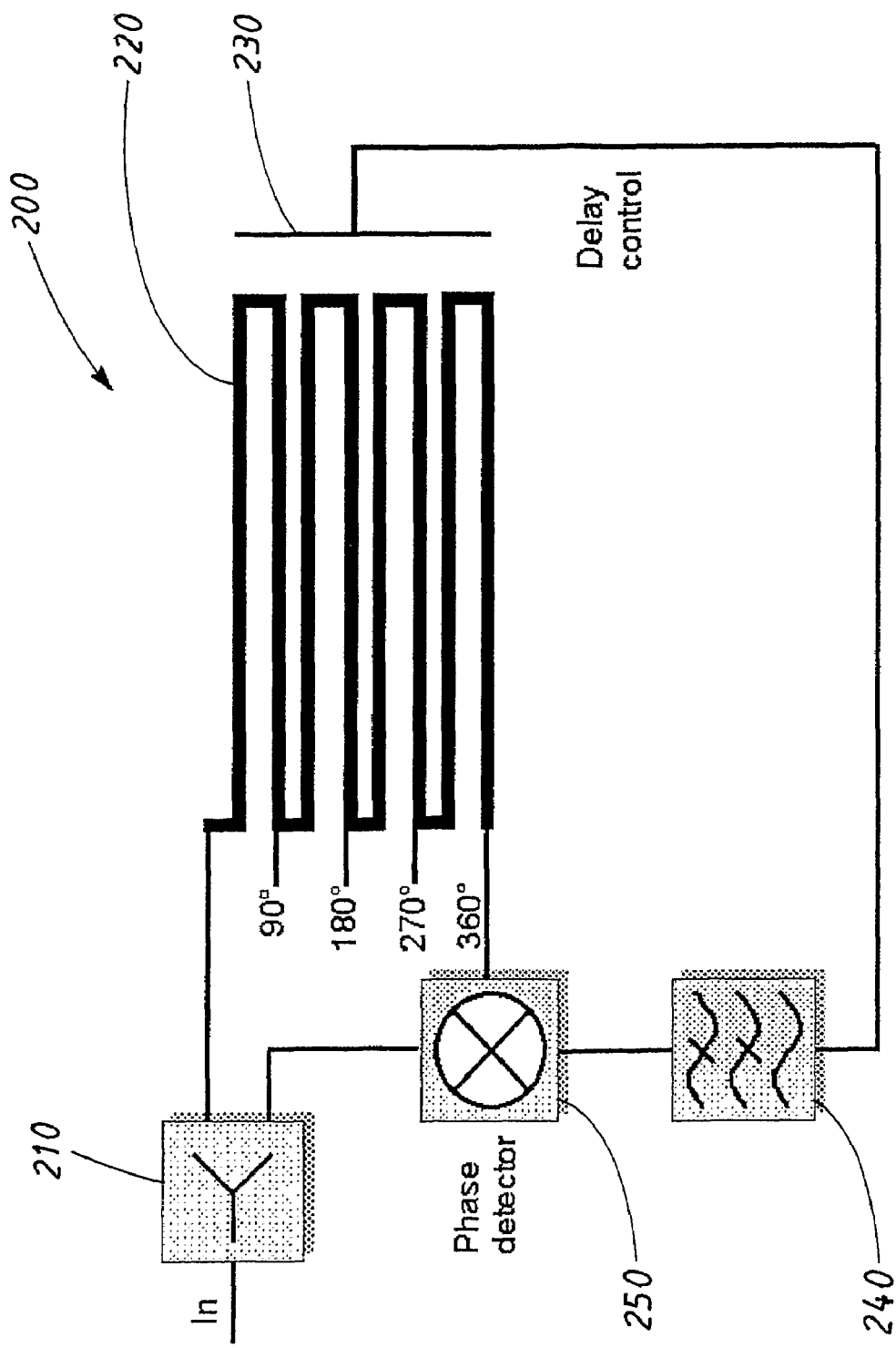

In FIG. 2, a DLL 200 according to the invention is shown, which overcomes this problem of known DLLs.

The DLL 200 of the example embodiment of FIG. 2, in similarity to earlier known DLLs, comprises an input means 210 for a signal $I_{in}$ which is to be delayed. The input means 210 split the input signal into a first and a second branch, and the signal in the first branch is connected to a component 220 for delaying the signal As opposed to the conventional DLL 100 shown in FIG. 1, the DLL 200 of the invention makes use of a passive tunable delay line 220 as the delaying component. The detailed function and design of this building block 220 of the DLL 200 will be elaborated upon in more detail below, in connection with FIG. 3.

However, one important characteristic of the tunable delay line 220 is that it is possible to tune the delay line so that the electrical distance to be covered by a signal in the line always remains the same, regardless of the frequency of the signal. This means that the phase of a signal entering the delay line 220 will always be the same at a fixed point in the delay line, regardless of the frequency or wavelength of the signal.

With renewed reference to FIG. 2, four points with known signal phase have been marked in the delay line 220. The phase at each of these points is known, either by measurement or calculation, and is, by way of example, shown as 90°, 180°, 270° and 360°. As mentioned earlier, the phase at these points will always remain essentially the same, regardless of the wavelength of the input signal, if the delay line is kept properly tuned, which will be explained below.

The input signal in the second branch is used as a non-delayed reference for the delay caused by the tuning line in the first branch, which is achieved by means of the input signal in the second branch being connected to a means 250 for phase comparison, in the example shown a phase detector 250. In order to get a second input signal, the phase detector 250 is connected to a point in the delay line with a well defined phase shift, in the example shown 360°.

Thus, the two input signals to the phase detector are the non-delayed signal from the first branch, and the signal from the second branch which has been shifted 360°. The phase difference between these two signals should accordingly be zero, resulting in an output signal from the phase detector which corresponds to zero phase difference. The output signal from the phase detector 250 is used as a reference signal or control signal for controlling the tunable delay line 220, preferably after having been passed through a low pass filter 240.

The filtered output signal from the phase detector 250 is then used as input to a control means 230 for controlling the electrical distance which a signal passing through the delay line will have to cover. In this way, the electrical distance can be kept at a constant and desired value, regardless of the wavelength of the input signal $I_{in}$.

It should be emphasized again that the phase delays shown in FIG. 2 and mentioned above are only examples, any phase difference can be obtained from the DLL 200 by accessing the proper points in the delay line.

As for the function of the filter 240, it could be mentioned that its function is an integrating one.

In addition, the phase detector 250 could in an alternative embodiment compare with another phase position than 360 degrees.

Figure 3:
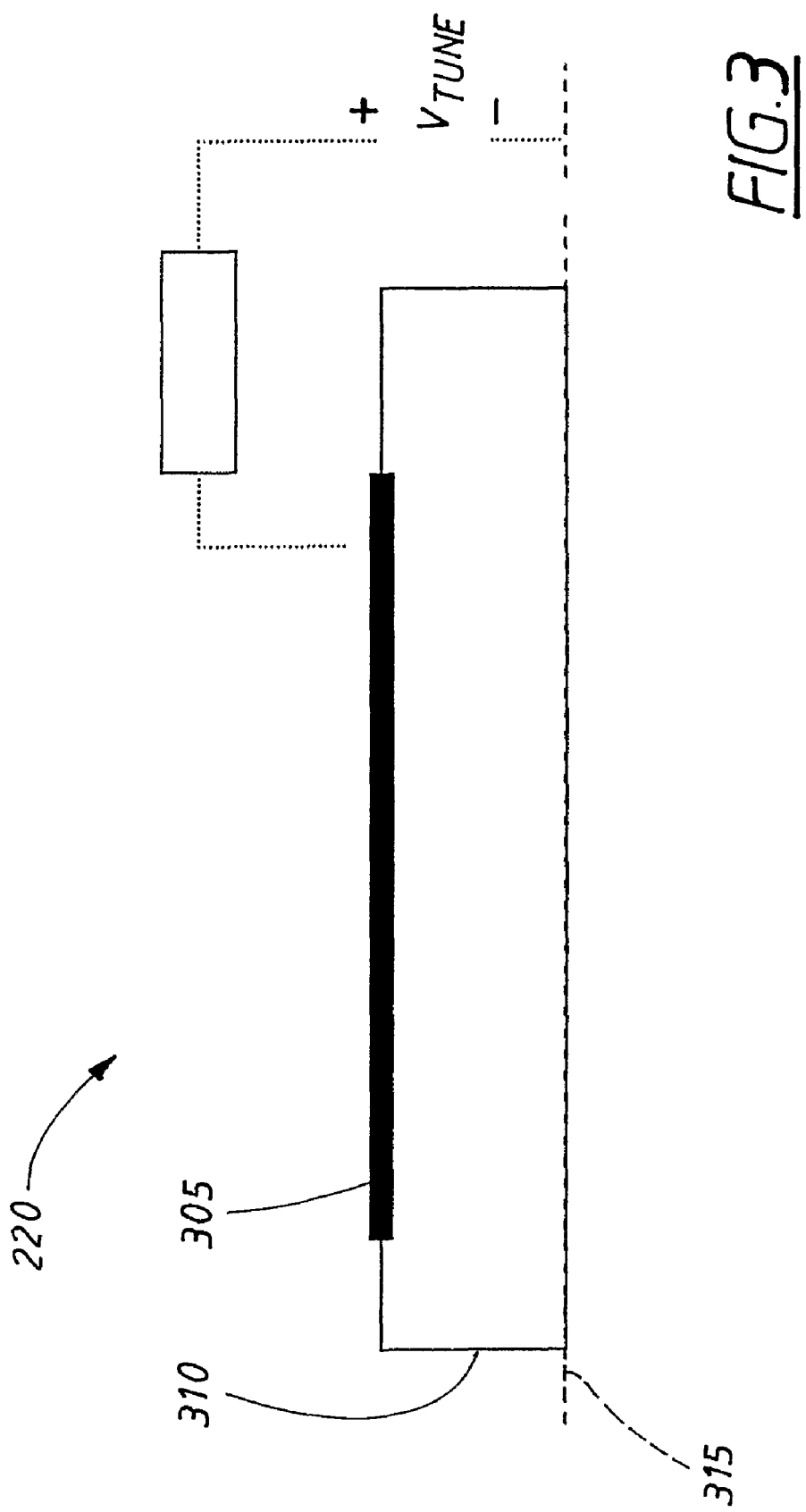
FIG. 3 shows a more detailed drawing of a delay component of an example embodiment.

In FIG. 3, a tunable delay line 220 as used in FIG. 2 is shown in more detail. As mentioned previously, the delay line 220 is preferably a tunable ferroelectric delay line. Such a delay line can comprise the components shown in FIG. 3. An electrical conductor 305 is supported by a dielectric material 310 which is a ferroelectric material. The ferroelectric material in turn rests on a ground plane 315. The control signal to the control means 230 shown in FIG. 2 is connected so that it applies a voltage, $V_{TUNE}$ between the conductor 305 and the ground plane 315, thereby altering the dielectric constant $\in$ of the material 310, which causes the electrical distance to be covered by a wave through the component 220 to vary as desired.

Suitably, the control signal, $V_{TUNE}$, is applied to the conductor via an electrical component such as a resistor or an inductance. This is in order to provide high impedance for the signal, but to simultaneously let through a DC or low frequency bias voltage.

Some advantages of the invention that might be mentioned are the following:

Since the circuit of the invention is passive, it doesn't interfere with the input signal, thus offering the possibility of using a modulated input signal.

Some advantages of the technology include the following:

Since the circuit is passive, it does not interfere with the input signal, thus offering the possibility of using a modulated input signal.

As a passive circuit, it does not consume power.

The circuit offers a wide tuning range.

The phase delay offered by the circuit can be chosen more or less arbitrarily, and changed over a continuous range.

The invention claimed is:

1. A delay-locked loop circuit comprising:
   input means for an input signal that is to be delayed, said input means comprising means for splitting said input signal into a first and a second branch;
   a component for delaying the signal in the first branch;
   the second branch being configured whereby the signal in the second branch is used as a non-delayed reference signal for a delay caused by the delay component in the first branch;
   wherein the delay component comprises a passive tunable delay line comprising an electrical conductor supported by a dielectric material, the delay component comprising plural signal phase take off points, the plural signal phase take off points having differing phase shifts relative to one another;
   tuning means for the tunable delay line, said tuning means being affected by said reference signal;
   wherein the first branch comprises output means for outputting a delayed signal with a chosen phase delay.

2. The circuit of claim 1, in which the delay component is continuously tunable.

3. The circuit of claim 1, in which the delay component is a passive component.

4. The circuit of claim 1, in which the delay component is a tunable ferroelectric delay line.

5. The circuit of claim 1, in which the second branch comprises a phase detector, by means of which the non-delayed signal of the second branch is compared to the delayed signal in the first branch at a point in the first branch where the delay to be caused by the delay component is known, the output signal from the phase detector being used as a control signal for the tuning means for the delay component of the first branch.

6. The circuit of claim 1, wherein the delay component comprises a ground plane which supports the dielectric material, and wherein a control signal applies a voltage between the electrical conductor and the ground plane to alter a dielectric constant of the dielectric material.

7. The circuit of claim 1, wherein a phase shift at each take off point remains the same regardless of wavelength of the input signal.

8. A delay-locked loop circuit comprising:
   a splitter configured to split an input signal that is to be delayed into a first branch and a second branch;
   a component for delaying the signal in the first branch, the delay component comprises a passive tunable delay line comprising an electrical conductor supported by a dielectric material, the delay component comprising plural signal phase take off points, the plural signal phase take off points having differing phase shifts relative to one another;
   the second branch being configured whereby the signal in the second branch is used as a non-delayed reference signal for a delay caused by the delay component in the first branch;
   a tuner configured to tune the delay line in accordance with the reference signal.

9. The circuit of claim 8, in which the delay component is continuously tunable.

10. The circuit of claim 8, in which the delay component is a passive component.

11. The circuit of claim 8, in which the delay component is a tunable ferroelectric delay line.

12. The circuit of claim 8, in which the second branch comprises a phase detector, by means of which the non-delayed signal of the second branch is compared to the delayed signal in the first branch at a point in the first branch where the delay to be caused by the delay component is known, the output signal from the phase detector being used as a control signal for the tuner for the delay component of the first branch.

13. The circuit of claim 8, wherein the delay component comprises a ground plane which supports the dielectric material, and wherein a control signal applies a voltage between the electrical conductor and the ground plane to alter a dielectric constant of the dielectric material.

14. The circuit of claim 8, wherein a phase shift at each take off point remains the same regardless of wavelength of the input signal.

* * * * *